(12) United States Patent
Gaiser et al.

(10) Patent No.: US 6,429,712 B1
(45) Date of Patent: Aug. 6, 2002

(54) PRECISION SET-RESET LOGIC CIRCUIT AND METHOD

(75) Inventors: Thomas A. Gaiser, Amherst, NH (US); Kenneth J. Stern, Newton, MA (US); Farhad Vazehgoo, Tynesborough, MA (US); Vincenzo DiTommaso, Arlington, MA (US); William L. Walter, Lowell, MA (US); Edward B. Hilton, Wayland, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/941,875

(22) Filed: Aug. 29, 2001

Related U.S. Application Data

(63) Continuation of application No. 09/456,748, filed on Dec. 7, 1999, now Pat. No. 6,326,828.

(51) Int. Cl.[7] .............................................. H03K 3/037
(52) U.S. Cl. ...................... 327/217; 327/222; 327/199
(58) Field of Search ............................... 327/215, 217, 327/219, 220, 222, 223, 199, 208, 405, 478, 482, 491, 563

(56) References Cited

U.S. PATENT DOCUMENTS

| | | | | |
|---|---|---|---|---|
| 4,806,786 A | * | 2/1989 | Valentine | 327/203 |
| 4,825,100 A | * | 4/1989 | Casplee | 327/208 |
| 4,855,617 A | * | 8/1989 | Ovens | 327/217 |
| 5,095,225 A | * | 3/1992 | Usui | 327/217 |
| 5,214,317 A | * | 5/1993 | Nguyen | 326/66 |
| 5,604,456 A | * | 2/1997 | Nitta | 327/217 |
| 6,107,853 A | * | 8/2000 | Nikolic et al. | 327/217 |
| 6,163,193 A | | 12/2000 | Kong | 327/217 |
| 6,326,828 B1 | * | 12/2001 | Gaiser et al. | 327/217 |

OTHER PUBLICATIONS

Motorola, Inc. *Mecl Data*, 1996, pp. 1–5.
Analog Devices, *ADRF ECL Cell Library Datasheet*, 1996, pp. 92–93.
Herbert Taub, Donald Schilling, *Digital Integrated Electronics*, Mc Graw–Hill, Inc., 1977, pp. 278–283.

* cited by examiner

*Primary Examiner*—Timothy P. Callahan
*Assistant Examiner*—Hai L. Nguyen
(74) *Attorney, Agent, or Firm*—Koppel, Jacobs, Patrick & Heybl

(57) ABSTRACT

A precision SET-RESET logic circuit and operating method separate a latch function from the critical signal path which produces the logic outputs. In a particular implementation the logic circuit includes two differential switch pairs controlled respectively by SET and RESET inputs, with respective enable circuits for the differential pair controlled by the output of the latch circuit. The SET and RESET differential switch pairs respond faster than the latch circuit to a change to the input SET-RESET state. A logic output is initially produced by establishing a first current path through. the differential switches and enable circuits in response to a new logic input, and then latched via a different current path.

26 Claims, 2 Drawing Sheets

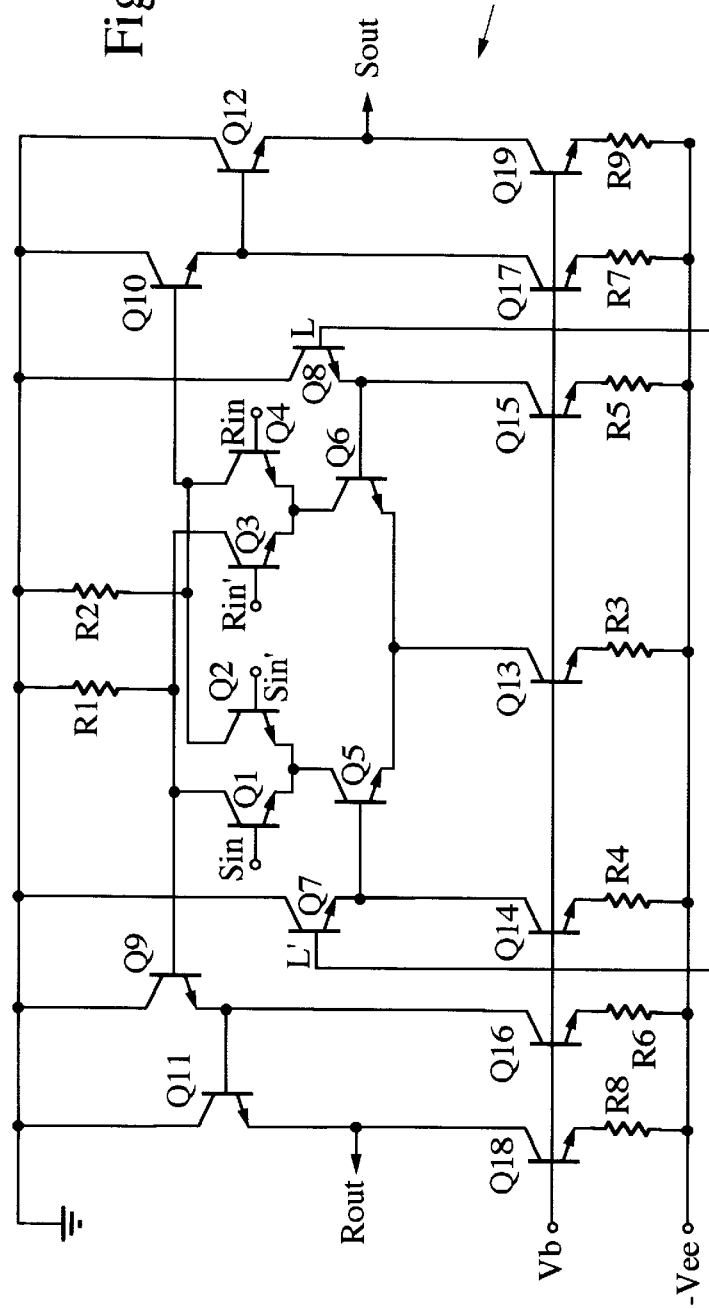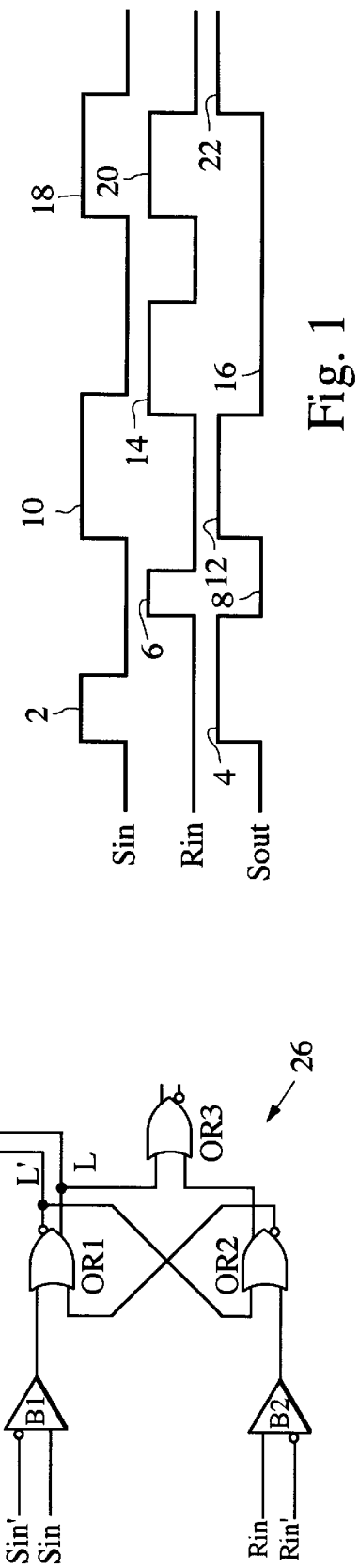

| | Sin | Rin | L | L' | Q1 | Q2 | Q3 | Q4 | Q5 | Q6 | Q7 | Q8 | Sout | Rout |
|---|---|---|---|---|---|---|---|---|---|---|---|---|---|---|
| INITIAL | LO | LO | LO | HI | OFF | (ON) | ON | OFF | (ON) | OFF | ON | OFF | LO | HI |
| Sin 2 APPLIED | HI | LO | LO | HI | (ON) | OFF | ON | OFF | (ON) | OFF | ON | OFF | HI | LO |
| LATCH RESPONDS | HI | LO | HI | LO | ON | OFF | (ON) | OFF | OFF | (ON) | OFF | ON | HI | LO |
| Sin 2 REMOVED | LO | LO | HI | LO | OFF | ON | (ON) | OFF | OFF | (ON) | OFF | ON | HI | LO |
| Rin 6 NAMED | LO | HI | HI | LO | OFF | ON | OFF | (ON) | OFF | (ON) | OFF | ON | LO | HI |
| LATCH RESPONDS | LO | HI | LO | HI | OFF | (ON) | ON | ON | (ON) | OFF | ON | OFF | LO | HI |
| Rin - REMOVED | LO | LO | LO | HI | OFF | (ON) | ON | OFF | (ON) | OFF | ON | OFF | LO | HI |
| Sin 10 APPLIED | HI | LO | LO | HI | (ON) | OFF | (ON) | OFF | (ON) | OFF | ON | OFF | HI | LO |
| LATCH RESPONDS | HI | LO | HI | LO | ON | OFF | OFF | (ON) | OFF | (ON) | OFF | ON | HI | LO |
| Rin 14 APPLIED | HI | HI | HI | LO | ON | OFF | OFF | (ON) | OFF | (ON) | OFF | ON | LO | HI |
| LATCH RESPONDS | HI | HI | HI | LO | OFF | OFF | OFF | (ON) | OFF | (ON) | OFF | ON | LO | HI |
| Sin 10 REMOVED | LO | HI | HI | LO | OFF | ON | OFF | ON | OFF | (ON) | OFF | ON | LO | HI |
| LATCH RESPONDS | LO | LO | LO | HI | OFF | (ON) | ON | OFF | (ON) | OFF | ON | OFF | LO | HI |
| Rin 14 REMOVED | LO | LO | LO | HI | OFF | (ON) | ON | OFF | (ON) | OFF | ON | OFF | LO | HI |

Fig. 3

PRECISION SET-RESET LOGIC CIRCUIT AND METHOD

This application is a continuation of Ser. No. 09/456,748, filed Dec. 7, 1999, now U.S. Pat. No. 6,326,828.

BACKGROUND OF THE INVENTION

1. Field of the Invention

This invention relates to SET-RESET latch circuits which produce logic latched outputs determined by SET and RESET inputs.

2. Description of the Related Art

Various types of circuits have been developed that produce and hold output states in response to input pulses. These include standard cell D-type flip-flop circuits with a clear (an example is the Motorola, Inc. MECL 10K circuit, described in MECL DATA by Motorola, Inc., 1996, page 1–5), the standard cell S-R (SET-RESET) latch (an example is described in Analog Devices, "ADRF ECL Cell Library Datasheet", 1996, and the solid state integrated logic flipflop or S-R latch in Taub and Schilling, "Digital Integrated Electronics", McGraw-Hill, Inc., 1977, pages 278–283.

Each of these circuits exhibits a degree of undesirable jitter and settling time in responding to control inputs. This lowers their bandwidth and makes the logic output lag undesirably behind the application of the control input.

SUMMARY OF THE INVENTION

This invention seeks to provide a precision SET-RESET logic circuit that produces a logic output whose rising and falling edges are defined precisely by the rising edges of its SET and RESET inputs, with a significant reduction in jitter and settling problems and an accompanying increase in bandwidth.

These goals are achieved by recognizing that the primary source of jitter and settling problems is in the storage element which provides a latch to maintain the output state of the S-R circuit after an input pulse has terminated. The invention removes the latch circuit from the critical signal path between the S-R inputs and the logic outputs, thus allowing for a very rapid logic response to a change in input, with the response sustained by the latch circuit once it has had an opportunity to reach a settled state. The latch circuit's signal path is longer than the input signal paths of the SET-RESET circuit.

In a preferred implementation, the SET-RESET circuit includes two pairs of primary differential switches and a secondary differential switch. The branches of the first primary switch are respectively controlled by SET and negated SET (SET') inputs, while the branches of the second primary switch are respectively controlled by RESET and negated RESET (RESET') inputs. The branches of the secondary differential switch provide current paths to control conduction through the first and second primary switches, respectively. SET and RESET outputs are produced in response to the application of SET and RESET inputs to the first and second primary differential switches, respectively.

The branches of the secondary differential switch respond respectively to LATCH and LATCH' inputs from the separate latch circuit. Initial current paths are established through the primary and secondary switches that control the SET and RESET outputs before the latch circuit has time to respond. The latch circuit then holds these outputs by establishing a different current path through the primary and secondary differential switches. The latch circuit itself can be designed as a cross-coupled NOR circuit, preferably with single-ended ECL (emitter coupled logic) elements.

These and other features and advantages of the invention will be apparent to those skilled in the art from the following detailed description, taken together with the accompanying drawings.

BRIEF DESCRIPTION OF THE DRAWINGS

FIG. 1 is a simplified signal trace illustrating the circuit's response to various SET and RESET inputs;

FIG. 2 is a schematic diagram of one embodiment of the invention; and

FIG. 3 is a chart illustrating the logic states of various elements in FIG. 2 in response to SET and RESET inputs as illustrated in FIG. 1.

DETAILED DESCRIPTION OF THE INVENTION

The overall function of the new S-R logic circuit is summarized in FIG. 1. Illustrative SET and RESET input signals are indicated by digital signal traces Sin and Rin, respectively, while the SET output is indicated by trace Sout; the RESET output Rout would be opposite to Sout. When a Sin pulse 2 appears, it very rapidly produces a corresponding Sout pulse 4, with the rising edges of pulses 2 and 4 nearly coinciding. The Sout pulse 4 is latched at a logic HI even after Sin pulse 2 has terminated, and does not revert to a logic LO until a RESET Rin pulse 6 appears. The logic LO state 8 for Sout is then latched beyond the termination of Rin pulse 6 until the appearance of the next Sin pulse 10, at which time Sout again goes to a HI state in pulse 12.

Assume next that another Rin pulse 14 appears before the termination of Sin pulse 10. The S-R circuit can be set up so that either the SET or RESET pulse dominates the output when both inputs are present. In this example the Rin pulse dominates, causing Sout to go LO when Rin pulse 14 first appears. This LO state 16 for Sout is latched through the next set of input pulses, illustrated as the simultaneous application of Sin pulse 18 and Rin pulse 20, again on the assumption that a RESET dominant circuit configuration has been selected. Sout enters a HI output state 22 when Rin pulse 20 terminates, since Sin pulse 18 continues beyond the termination of pulse 20. With the circuit set up so that the last input pulse to be released takes precedence over the output, the HI Sout pulse 22 continues HI after Sin pulse 18 terminates.

This general logic pattern is not novel, but has been described to put the invention in context. The input pulses Sin and Rin and output pulses Sout are illustrated as having very rapidly rising leading edges. In practice, however, the pulse characteristics have not been so ideal with past S-R logic circuits. Due to delays and signal processing effects within the logic circuitry, there have been transitory ambiguities as to the presence or absence of an input pulse. The result has been not only an undesirable lag in the production of a true output, but also the possibility of false outputs. For example, if the logic circuitry allows for an input pulse with a rapidly rising leading edge that oscillates or is otherwise lacking in smoothness, a drop in the SET input pulse might be interpreted as the application of a RESET input pulse, resulting in a false RESET output. If, on the other hand, the logic circuitry produces a smoothly rising leading edge for an input pulse, this stretches out the period before the pulses reaches its full value, leading to a degree of uncertainty as to when the pulse actually commenced and the possibility of missing a SET output entirely if a RESET input pulse arrives before a SET input has been applied long enough to produce a SET output.

The invention recognizes that such distortions to the input pulses are largely a result of the latch circuitry that is conventionally used to store the last output state after the initiating input pulse has terminated. The problem is resolved by removing the latch circuitry from the critical input-output logic signal path. This allows for a very rapid and accurate logic response to an input pulse, followed by a signal latching action that can still be subject to the defects found in the prior art. However, since the latch circuit is out of the critical logic signal path, these deficiencies do not degrade the logic output. The logic circuitry will normally have time to operate before an input pulse terminates or an opposite input is applied, so that the lag in establishing a latch will not detract from the circuit's desired operation.

A circuit that can be used to implement the invention is shown in FIG. 2. It has two principal subcircuits: an S-R logic circuit 24 that provides the basic logic response to SET and RESET input signals, and a latch circuit 26 that is outside of the direct input-output signal path for the logic circuit 24 and has a slower response.

The latch circuit 26 can be implemented as a cross-coupled NOR circuit which produces latch (L) and negated latch (L') outputs in response to input SET (Sin), negated SET (Sin'), RESET (Rin), and negated RESET (Rin') signals. The circuit preferably uses single-ended emitter coupled logic (ECL) gates, which produce relatively clean outputs. The Sin and Sin' inputs are applied to a buffer B1, which converts the differential SET input to a single-ended input to a first OR gate OR1. Similarly, Rin and Rin' are applied to another buffer B2 and converted to a single-ended input to another OR gate OR2. OR1 and OR2 are cross-coupled, yielding an overall NOR gate whose outputs L and L' are taken from the true and negated outputs of OR1, respectively. This results in a RESET dominance for the overall S-R circuit, and a SET dominance for the latch circuit. If SET dominance is desired for the overall S-R circuit (the choice is somewhat arbitrary), the output from the NOR gate could be taken from the outputs of OR2 instead. A dummy OR gate OR3 receives inputs from the true outputs of OR1 and OR2 to equalize the loadings on their dual outputs.

The main S-R circuit 24 is shown implemented with npn bipolar transistors and power supply voltage references of ground and −Vee (typically −5.2 volts). Other transistor types could also be employed, such as pnp bipolar transistors with a positive voltage supply, or field effect transistors (if their lower speed would be acceptable).

In the particular circuit shown, no signals swing from ground to −Vee. All signals swing typically 300 mV. For differential signals such as Sin and Sin', the signal that is the higher of the two is considered to be a logic HI, and the lower of the two is considered to be a logic LO. For single-ended signals, such as those present in the latch circuit, if a signal is well above the level of the latch bias it is at a logic HI; if it is below the latch bias, it is at a logic LO.

The logic circuit 24 includes a pair of primary differential switches Q1–Q2 and Q3–Q4, whose bases are respectively connected to receive Sin, Sin', Rin', and Rin as inputs. A secondary differential switch consisting of transistors Q5 and Q6 controls the flow of current through the two primary differential switches, with the collector of Q5 connected to the common emitter connection for Q1 and Q2, and the collector of Q6 connected to the common emitter connection for Q3 and Q4. The conduction of Q5 and Q6 in turn is controlled by the latch outputs L' and L, respectively. This is accomplished by applying L' to the base of a transistor Q7 whose collector-emitter circuit is connected between ground and the base of Q5, and L to the base of a transistor Q8 whose collector-emitter circuit is connected between ground and the base of Q6. When L is applied, indicating the presence of an Sin signal at the input to the latch circuit 26, the emitter of Q8 is set to a voltage higher than the emitter of Q7 (typically 300 mV). Hence the base of Q6 is at a higher voltage than the base of Q5. This turns Q6 ON and allows current to flow through the Q3–Q4 primary differential switch. At the same time, Q5 turns OFF because its base voltage is at a lower potential than the base of Q6, thus preventing any current flow through the first primary differential switch Q1–Q2.

Conversely, when Rin and Sin' are applied to the latch circuit 26 to produce an L' output, Q5 turns ON to allow conduction through the Q1–Q2 differential switch, while Q6 turns OFF to inhibit current flow through the Q3–Q4 differential switch. Q5/Q7 and Q6/Q8 thus function as current control circuits for the first and second differential switches, respectively.

The logic circuit 24 operates to produce an Sout output in response to Sin and Rin' inputs, and (because of the S-R circuit's overall RESET dominance) an Rout output in response to Rin together with either Sin or Sin' inputs. In the particular embodiment shown, this is achieved by connecting a first resistor R1 between the ground reference and the collectors of Q1 and Q3, a second resistor R2 between the ground reference and the collectors of Q2 and Q4, and deriving the S-R circuit outputs from the current flows through R1 and R2. This takes place via a pair of transistors Q9 and Q10 whose bases are connected respectively to the opposite sides of resistors R1 and R2 from the ground reference, with their collectors connected to the ground reference, and a second pair of transistors Q11 and Q12 whose bases are connected respectively to the emitters of Q9 and Q10, with their collectors connected to the ground reference and their emitters connected respectively to the Rout and Sout output nodes. A bias circuit is provided by transistors Q13, Q14, Q15, Q16, Q17, Q18, and Q19, all of which are biased by a common base voltage Vb, with their collectors connected respectively to the emitters of Q5/Q6, Q7, Q8, Q9, Q10, Q11, and Q12, and their emitters connected to −Vee respectively through bias resistors R3, R4, R5, R6, R7, R8, and R9. Acceptable resistance values are 1.25 kohm for R1–R3, R8, and R9, and 5.0 kohm for R4–R7.

Q9–Q12 are configured as emitter-followers and act as unity gain buffers. Their main purposes are to provide a low impedance drive on the output node (much lower than the impedance of R1 and R2 would provide), and to provide level translation. Low impedance is important to enable the circuit to drive parasitic and load capacitances without significant signal degradation. Each emitter-follower imparts a 1 Vbe level shift drop in the output voltage.

Note that the input signal paths for Sin, Sin', Rin' and Rin to input transistors Q1–Q4 are always shorter than the signal paths of the same input signals through the latch circuit. Thus, the latch response time to Sin and Rin is always longer than the response time of the primary differential switches. This allows the logic circuit to react very rapidly to a change in input signals, followed by the latch circuit operating to latch the new logic state. Thus, the overall circuit achieves the stability of a latch that maintains a fixed logic state, but without the sacrifice in speed that normally accompanies a latch function.

FIG. 3 summarizes the response of the FIG. 2 circuit to the first several pulses illustrated in FIG. 1. Assume that initially, immediately prior to the application of Sin pulse 2, both Sin and Rin are at a logic LO, with the latch outputs L at logic LO and L' HI. As indicated on the "INITIAL" line of FIG. 3, this causes the Q1 branch of the first primary differential switch to be OFF and the Q2 branch ON, the Q3 branch of the second primary differential switch ON and the Q4 branch OFF, and Q5 in the secondary differential switch ON with Q6 OFF. A current path is thus established through Q2 and Q5 that draws current through R2, producing a voltage drop across R2 to lower the base voltage of Q10, resulting in the voltage at the base of Q12 being lowered by an equal amount (the transistors included in the current path are circled in FIG. 3). This in turn lowers the voltage at Sout to a logic LO, i.e. Sout is lower in potential than Rout. Q1 and Q6 both being OFF prevents any current flow through R1, which sets the base voltage of Q9 at the high reference ground, setting the base of Q9 higher than the base of Q10. As a result, the base of Q11 is also higher than the base of Q12. Hence, the voltage at Rout is greater than the voltage at Sout, indicating that Rout is a logic HI and Sout is a logic LO.

When the Sin pulse 2 is first applied ("Sin 2 APPLIED" in FIG. 3), the transistors in the Q1–Q2 primary differential switch change state, with Q1 turning ON and Q2 OFF. The RESET inputs remain unchanged, so Q3 remains ON and Q4 OFF. Also, since the latch circuit 26 has not had enough time to respond when Q1 and Q2 first respond to the Sin signal, L remains LO and L' remains HI, keeping Q5 ON with Q6 OFF. Thus, the previous current path through Q2 and Q5 is terminated and a new current path through Q1 and Q5 is established. R1 is thus included in the main current path, while no current can flow through R2. This reverses the relative voltage levels and hence the logic states of Q9–Q12, resulting in Sout going HI and Rout going LO.

The latch circuit 26 next completes its response to the Sin signal, placing the L output HI and L' LO (shown on the first "LATCH RESPONDS" line of FIG. 3). Since Sin and Rin have not changed, the switching states of Q1–Q4 remain the same. However, since L and L' have changed states, the switching states of Q5 and Q6 also reverse. This opens a new current path, through Q3 and Q6, which maintains the current flow through R1, latching Sout HI and Rout LO.

The latch remains in place after Sin pulse 2 has terminated ("SET REMOVED" in FIG. 3), which maintains the current path through Q3 and Q6, thus holding the latch on the Sout and Rout outputs. Although Q1 and Q2 have reversed switching states from the removal of Sin, this has no effect on Sout and Rout because Q1 and Q2 are not included in the through current path. In the absence of Sin and Rin, the latch retains its most recent state.

Assume now that Rin pulse 6 is applied ("Rin 6 APPLIED" in FIG. 3). This causes Rin to be HI but does not change L or L', resulting in a current path through Q4 and Q6 that sets Sout LO and Rout HI. When the latch circuit has had time to respond (second "LATCH RESPONDS" in FIG. 3), setting L LO and L' HI, the current path switches to Q2 and Q5 but current still flows through R2, latching Sout LO and Rout HI. At the conclusion of Rin pulse 6 ("Rin REMOVED" in FIG. 3), Rin goes LO, reversing the switching states of Q3 and Q4. However, this does not disturb the current path through Q2 and Q5, so the outputs Sout and Rout remain latched in the their LO and HI states, respectively.

When Sin pulse 10 is applied ("Sin APPLIED"); the circuit responds the same as it did to Sin pulse 2, both before and after the latch circuit has had time to operate. Rin pulse 14 is then applied ("Rin 14 APPLIED"), reversing the conductive states of Q3 and Q4 so that Q3 is OFF and Q4 ON. The current path is now through Q4 and Q6, which sets Sout LO and Rout HI. The overall logic circuit is thus seen to be RESET dominant; RESET dominates when both SET and RESET signals are applied. The latch circuit 26 in this particular implementation is SET dominant, so that the latch outputs do not change when the latch circuit has responded (third "LATCH RESPONDS" in FIG. 3), L remaining HI and L' remaining LO. All of the transistor states thus remain the same, with Sout latched LO and Rout latched HI.

The termination of Sin pulse 10 ("Sin 10 REMOVED") reverses the conductive states of Q1 and Q2. However, this has no effect on Sout and Rout, since the current path initially remains through Q4 and Q6. However, the latch circuit responds to the removal of Sin pulse 10 (fourth "LATCH RESPONDS") by setting L LO and L' HI, since the reset pulse 14 is still being applied. This reverses the switching states of Q5 and Q6, turning Q5 ON and Q6 OFF. But Sout and Rout remain respectively LO and HI, since a new current path is established through Q2 and Q5 that maintains the current transmitted through R2 by the immediately prior Q4–Q6 current path. This is consistent with the RESET dominant nature of the overall logic circuit.

Finally, Rn pulse 14 terminates ("Rin 14 REMOVED"), causing the conductive states of Q3 and Q4 to reverse. But this does not effect the current path through Q2 and Q5, so Sout remains LO and Rout remains HI. The latch circuit maintains the latched outputs L LO and L' HI, thus maintaining Sout LO and Rout HI.

It can thus be seen that, when the logic outputs Sout and Rout change in response to a changed input that shifts the current flow between R1 and R2, the latch operates to maintain the changed output by establishing a new current path to keep the current flow through the new resistor. This allows for a rapid response by the logic circuit without the output aberrations normally associated with a latch function.

While a particular illustrative embodiment of the invention has been shown and described, numerous variations and alternate embodiments will occur to those skilled in the art. It is therefore intended that the invention be limited only by the appended claims.

We claim:

1. A precision SET-RESET logic circuit, comprising:
   a SET-RESET circuit which receives and responds to SET-RESET inputs to produce SET-RESET outputs via first switch circuits over a settling time, and
   a latch circuit which receives and responds to said SET-RESET inputs to apply a latch to sustain said SET-RESET outputs, via second switch circuits in said SET-RESET circuit that are different from said first switch circuits, once the SET-RESET circuit has had an opportunity to reach a settled state.

2. The precision SET-RESET logic circuit of claim 1, wherein said latch circuit responds to said SET-RESET inputs to apply said latch to said SET-RESET circuit outputs via a latch signal path which is longer than input signal paths of said SET-RESET circuit.

3. The precision SET-RESET logic circuit of claim 1, wherein said latch circuit is configured to maintain its most recent latch state in response to an input transition which leaves both of said SET and RESET inputs at logic LOW.

4. A precision SET-RESET logic circuit, comprising:
   a SET-RESET circuit which receives and responds to SET-RESET inputs to produce SET-RESET outputs via first switch circuits over a settling time, and includes SET and RESET control circuits which respond to said SET-RESET inputs to establish SET and RESET outputs, respectively, and a latch circuit which receives and responds to said SET-RESET inputs to apply a latch to sustain said SET-RESET outputs, via second switch circuits in said SET-RESET circuit that are different from said first switch circuits, once the SET-RESET circuit has had an opportunity to reach a settled state, said latch circuit connected to selectively enable and disable said control circuits.

5. The precision SET-RESET logic circuit of claim 4, wherein said latch circuit enables a control over said SET-RESET outputs by the SET or RESET input signal opposite to that which established the latch circuit's most recent state.

6. A method of establishing SET-RESET control signals, comprising:

initially producing SET-RESET outputs in response to SET-RESET input signals via first switch circuit paths, and latching the state of said outputs in parallel with and lagging their production via second switch circuit paths that are different from said first switch circuit paths.

7. The method of claim 6, wherein the immediately preceding SET-RESET output state is latched in response to said SET and RESET input signals both being logic LOW.

8. A SET-RESET control method, comprising:

initially producing a SET or RESET output via a first switch circuit path in response to one of SET or RESET inputs, respectively, and latching said output subsequent to its initial production, via a second switch circuit path that is different from said first switch circuit path, for control by the other of said inputs.

9. The method of claim 8, wherein said output is established over a shorter signal path than said latch.

10. The method of claim 8, wherein the immediately preceding SET-RESET output state is latched in response to said SET and RESET inputs both being logic LOW.

11. A precision SET-RESET logic circuit, comprising:

a SET-RESET circuit which responds to SET-RESET inputs to produce SET-RESET outputs through respective first switch circuit paths in said SET-RESET circuit, and a latch circuit which is out of the input signal path of said SET-RESET circuit and has alternate output states latching SET and RESET outputs, respectively, from said SET-RESET circuit through respective second switch circuit paths in said SET-RESET circuit which are different from said first switch circuit paths, said latch circuit responding to active SET-RESET inputs to disable the first switch circuit path which corresponds to the SET-RESET circuit's current output state, and to enable another of said first switch circuit paths to respond to inputs opposite to the SET-RESET circuit's current output state.

12. The precision SET-RESET logic circuit of claim 11, wherein said latch circuit responds to said SET-RESET inputs to produce a latched output for said SET-RESET circuit via a latch signal path which is longer than input signal paths of said SET-RESET circuit.

13. The precision SET-RESET logic circuit of claim 11, wherein said SET-RESET circuit includes SET and RESET control circuits which respond to said SET-RESET inputs to establish SET and RESET outputs, respectively, and said latch circuit is connected to selectively enable and disable said control circuits.

14. The precision SET-RESET logic circuit of claim 13, wherein said latch circuit enables a control over said SET-RESET outputs by the SET or RESET input signal opposite to that which established the latch circuit's most recent state.

15. The precision SET-RESET logic circuit of claim 11, wherein said latch circuit is configured to maintain its most recent latch state in response to an input transition which leaves both of said SET and RESET inputs at logic LOW.

16. A precision SET-RESET logic circuit, comprising:

a latch circuit which has SET and RESET inputs and which produces a latch output indicative of whether its most recent logic HIGH input was SET or RESET, and a SET-RESET circuit, comprising:

SET and RESET differential switch pairs respectively controlled by said SET and RESET inputs and connected to switch between alternate respective branches, respective enable circuits for said differential pairs connected to enable a selected one of said differential pairs and to disable the other differential pair under the control of said latch output, and an output circuit which produces SET-RESET outputs through selected branches of said differential pairs in response to the switching state of the enabled differential switch pair, said latch circuit being out of the input signal path of said SET-RESET circuit and having alternate output states latching SET and RESET outputs, respectively, from said SET-RESET circuit through the branches of said differential pairs opposite to said selected branches, said latch circuit responding to active SET-RESET inputs to disable the selected differential switch branch which corresponds to the SET-RESET circuit's current output state, and to enable the other selected differential switch branch to respond to inputs opposite to the SET-RESET circuit's current output state.

17. The precision SET-RESET logic circuit of claim 16, wherein said latch circuit is outside signal paths between said SET and RESET differential switch pairs and said SET-RESET outputs.

18. The precision SET-RESET logic circuit of claim 17, wherein said SET and RESET differential switch pairs respond faster than said latch circuit to a change in the input SET-RESET state.

19. The precision SET-RESET logic circuit of claim 16, wherein said enable circuits comprise respective switches for said SET and RESET differential switch pairs and controlled by said latch output.

20. The precision SET-RESET logic circuit of claim 16, wherein said latch circuit comprises a cross-coupled NOR circuit.

21. The precision SET-RESET logic circuit of claim 20, wherein said cross-coupled NOR circuit employs single-ended ECL (emitter coupled logic) elements.

22. A method of establishing SET-RESET control signals, comprising:

producing SET-RESET outputs from a SET-RESET circuit in response to SET-RESET input signals, and latching the state of said outputs in parallel with and lagging their production with a latch signal that inhibits the SET-RESET circuit from producing an output response to inputs which correspond to the current SET-RESET circuit output state, and enables the SET-RESET circuit to produce an output response to inputs which correspond to a SET-RESET circuit output state opposite to the current output state.

23. The method of claim 22, wherein the immediately preceding SET-RESET output state is latched in response to said SET and RESET input signals both being logic LOW.

24. A SET-RESET control method, comprising:

producing a SET or RESET output from a SET-RESET circuit in response to a SET or RESET input, respectively, and latching said output subsequent to its initial production, for control by the other of said inputs, with a latch signal that inhibits said SET-RESET circuit from producing an output response to an input which corresponds to the current SET-RESET circuit output state, and enables said SET-RESET circuit to produce an output response to an input which corresponds to an output state opposite to the current output state.

25. The method of claim 24, wherein said output is established over a shorter signal path than said latch.

26. The method of claim 24, wherein the immediately preceding SET-RESET output state is latched in response to said SET and RESET inputs both being logic LOW.

* * * * *